United States Patent
Iwano et al.

(10) Patent No.: US 10,734,205 B2
(45) Date of Patent: Aug. 4, 2020

(54) CLEANING METHOD AND PLASMA PROCESSING APPARATUS

(71) Applicant: Tokyo Electron Limited, Tokyo (JP)

(72) Inventors: Mitsuhiro Iwano, Miyagi (JP); Masanori Hosoya, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/557,669

(22) Filed: Aug. 30, 2019

(65) Prior Publication Data
US 2020/0135436 A1 Apr. 30, 2020

(30) Foreign Application Priority Data

Oct. 25, 2018 (JP) .................. 2018-200988

(51) Int. Cl.
*H01J 37/32* (2006.01)
*B08B 7/00* (2006.01)

(52) U.S. Cl.
CPC .. *H01J 37/32862* (2013.01); *H01J 37/32091* (2013.01); *H01J 37/32568* (2013.01); *H01J 37/32669* (2013.01); *B08B 7/0035* (2013.01); *H01J 37/32449* (2013.01)

(58) Field of Classification Search
CPC .............. B08B 7/0035; H01J 37/32091; H01J 37/32449; H01J 37/32568; H01J 37/32669; H01J 37/32862
See application file for complete search history.

(56) References Cited

U.S. PATENT DOCUMENTS

| | | | |
|---|---|---|---|
| 5,756,400 A * | 5/1998 | Ye | B08B 7/0042 438/710 |
| 2004/0125359 A1* | 7/2004 | Ludviksson | G01N 21/64 356/72 |
| 2005/0173069 A1* | 8/2005 | Tolmachev | H01J 37/32192 156/345.36 |
| 2010/0314356 A1* | 12/2010 | Nagayama | C23C 16/0227 216/52 |
| 2016/0093473 A1* | 3/2016 | Moon | H01J 37/32642 216/58 |
| 2017/0301578 A1* | 10/2017 | Hong | H01J 37/32853 |
| 2018/0090345 A1* | 3/2018 | Kouzuma | H01J 37/32862 |
| 2019/0043699 A1* | 2/2019 | Cho | H01J 37/32715 |

FOREIGN PATENT DOCUMENTS

JP 2015-170611 A 9/2015

* cited by examiner

*Primary Examiner* — Alexander H Taningco
*Assistant Examiner* — Kurtis R Bahr
(74) *Attorney, Agent, or Firm* — Studebaker & Brackett PC

(57) ABSTRACT

In a cleaning method according to an exemplary embodiment, a plasma is formed from a cleaning gas in a chamber of a plasma processing apparatus. A focus ring is mounted on a substrate support in the chamber to extend around a central axis of the chamber. While the plasma is formed, a magnetic field distribution is formed in the chamber by an electromagnet. The magnetic field distribution has a maximum horizontal component in a location on the focus ring or a location outside the focus ring in a radial direction with respect to the central axis.

14 Claims, 3 Drawing Sheets

CLEANING METHOD AND PLASMA PROCESSING APPARATUS

CROSS-REFERENCE TO RELATED APPLICATIONS

This application is based on and claims the benefit of priority from Japanese Patent Application No. 2018-200988 filed on Oct. 25, 2018, the entire contents of which are incorporated herein by reference.

TECHNICAL FIELD

Exemplary embodiments of the present disclosure relate to a cleaning method and a plasma processing apparatus.

BACKGROUND

A plasma processing apparatus is used to perform plasma processing on a substrate. The plasma processing apparatus includes a chamber and a substrate support. The substrate support is provided in the chamber. In the plasma processing apparatus, a process gas is supplied into the chamber and a plasma is formed from the process gas. The substrate is processed by chemical species from the plasma of the process gas.

In the plasma processing, reaction products are generated. The reaction products adhere to a wall surface in the chamber and form deposits. It is necessary to remove the deposits formed on the wall surface in the chamber. Japanese Patent Application Laid-Open Publication No. 2015-170611 discloses a cleaning method for removing deposits formed on a surface of an upper electrode of a capacitively-coupled plasma processing apparatus.

SUMMARY

In one exemplary embodiment, a cleaning method is provided. The cleaning method includes supplying a cleaning gas into a chamber of a plasma processing apparatus. The cleaning method further includes forming a plasma from the cleaning gas in the chamber to perform cleaning on a wall surface in the chamber. In the supplying a cleaning gas and the forming a plasma, a focus ring is mounted on a substrate support in the chamber to extend around a central axis of the chamber. In the forming a plasma, a magnetic field distribution is formed in the chamber by an electromagnet. The magnetic field distribution has a maximum horizontal component in a location on the focus ring or a location outside the focus ring in a radial direction with respect to the central axis.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
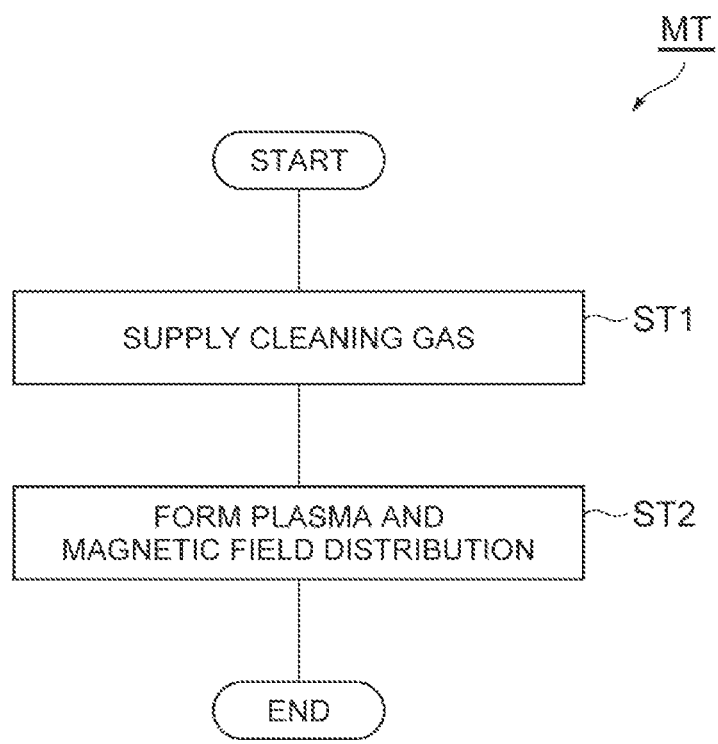
FIG. 1 is a flowchart illustrating a cleaning method according to one exemplary embodiment.

Hereinafter, various exemplary embodiments will be described.

In one exemplary embodiment, a cleaning method is provided. The cleaning method includes supplying a cleaning gas into a chamber of a plasma processing apparatus. The cleaning method further includes forming a plasma from the cleaning gas in the chamber to perform cleaning on a wall surface in the chamber. In the supplying a cleaning gas and the forming a plasma, a focus ring is mounted on a substrate support in the chamber to extend around a central axis of the chamber. In the forming a plasma, a magnetic field distribution is formed in the chamber by an electromagnet. The magnetic field distribution has a maximum horizontal component in a location on the focus ring or a location outside the focus ring in a radial direction with respect to the central axis.

According to the cleaning method according to the above embodiment, in a case where the above-described magnetic field distribution is formed, a density of the plasma increases in a location close to the wall surface in the chamber on a side of the substrate support. As a result, deposits are effectively removed from the wall surface in the chamber on the side of the substrate support.

In one exemplary embodiment, the magnetic field distribution may have the maximum horizontal component in the location outside the focus ring in the radial direction.

In one exemplary embodiment, the electromagnet has a coil provided above the chamber. The coil extends in a circumferential direction around the central axis. A value defined by ½ of a sum of an inner diameter and an outer diameter of the coil may be larger than an outer diameter of the focus ring. According to the embodiment, the maximum horizontal component of the above-described magnetic field distribution is acquired in a location which has a distance defined by ¼ of the sum of the inner diameter and the outer diameter of the coil from the central axis. This location is a location outside the focus ring in the radial direction. Accordingly, a density of the plasma increases in the location close to the wall surface in the chamber on the side of the substrate support.

In one exemplary embodiment, the inner diameter of the coil may be larger than an inner diameter of the focus ring and may be smaller than the outer diameter of the focus ring. According to the embodiment, the deposits formed on the focus ring may be effectively removed.

In one exemplary embodiment, the supplying a cleaning gas and the forming a plasma may be performed in a state in which an object is not mounted on the substrate support in an area surrounded by the focus ring. Alternatively, the supplying a cleaning gas and the forming a plasma may be performed in a state in which a dummy substrate is mounted on the substrate support in an area surrounded by the focus ring.

In another exemplary embodiment, a plasma processing apparatus is provided. The plasma processing apparatus includes a chamber, a substrate support, a gas supply unit, a radio frequency power source, an electromagnet, a drive power source, and a controller. The substrate support is provided in the chamber. The gas supply unit is configured to supply a cleaning gas into the chamber. The radio frequency power source is configured to generate a radio frequency electric power to generate plasma from a gas in the chamber. The electromagnet is configured to form a magnetic field distribution in the chamber. The drive power source is electrically connected to the electromagnet. The controller is configured to control the gas supply unit, the radio frequency power source, and the drive power source. In the plasma processing apparatus, a focus ring is mounted on the substrate support to extend around a central axis of the chamber. The controller controls the gas supply unit to supply the cleaning gas into the chamber. The controller controls the radio frequency power source to supply the radio frequency electric power to perform cleaning on a wall surface in the chamber by forming a plasma from the cleaning gas in the chamber. The controller controls the drive power source to form a magnetic field distribution having a maximum horizontal component in a location on the focus ring or a location outside the focus ring in the chamber by the electromagnet in a radial direction with respect to the central axis, while the plasma is generated.

In one exemplary embodiment, the magnetic field distribution may have the maximum horizontal component in the location outside the focus ring in the radial direction.

In one exemplary embodiment, the electromagnet has a coil provided above the chamber. The coil extends in a circumferential direction around the central axis. A value defined by ½ of a sum of an inner diameter and an outer diameter of the coil may be larger than an outer diameter of the focus ring.

In one exemplary embodiment, the inner diameter of the coil may be larger than an inner diameter of the focus ring and may be smaller than the outer diameter of the focus ring.

Hereinafter, various embodiments will be described in detail with reference to the drawings. In the drawing, the same or equivalent portions are denoted by the same reference symbols.

FIG. 1 is a flowchart illustrating a cleaning method according to one exemplary embodiment. The cleaning method (hereinafter, referred to as a "method MT") illustrated in FIG. 1 is performed to clean a plasma processing apparatus. In the method MT, deposits formed on a wall surface in a chamber are removed. The deposits are formed because reaction products, generated in plasma processing in the plasma processing apparatus, are attached to the wall surface in the chamber.

Figure 2:
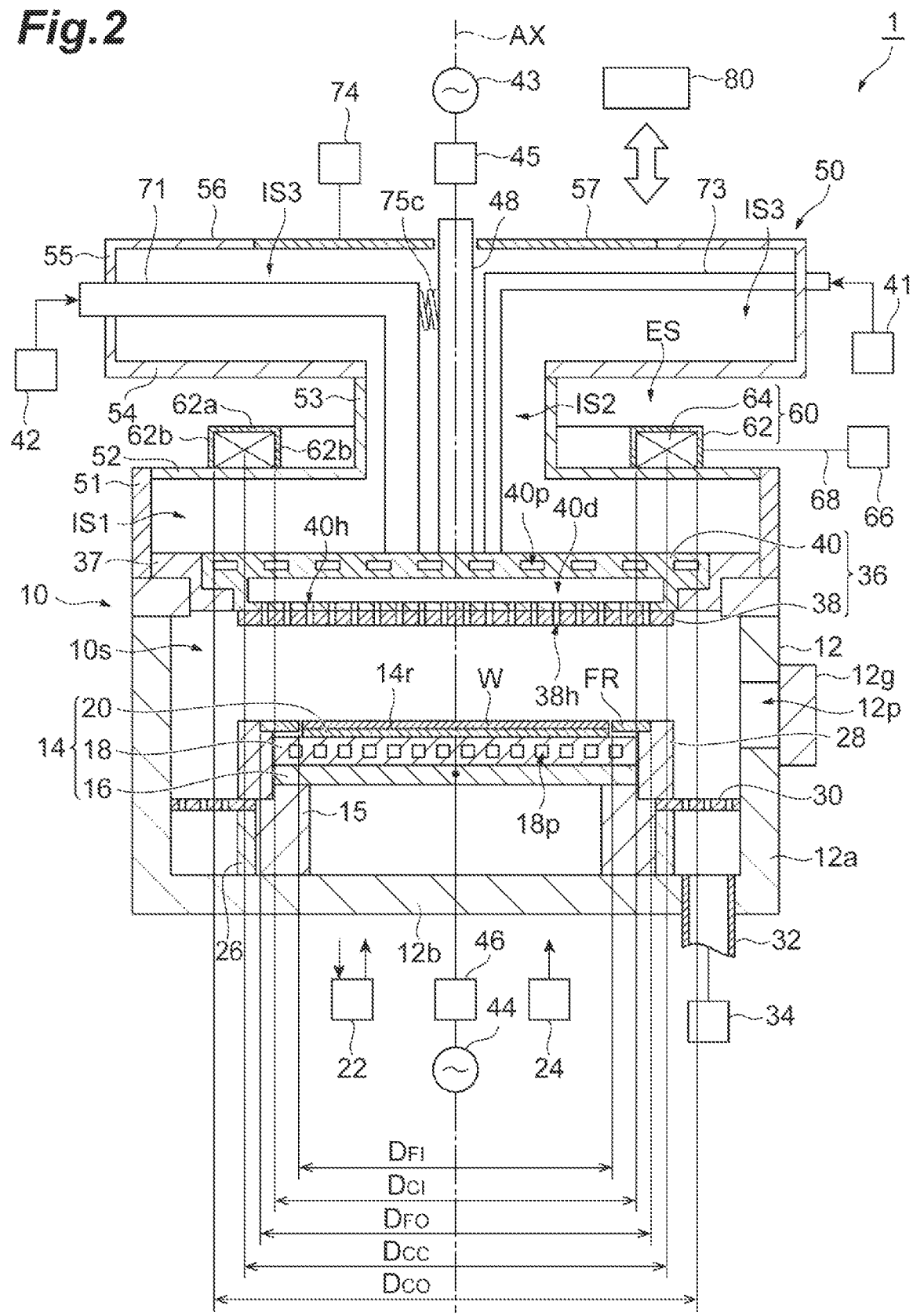
FIG. 2 is a diagram schematically illustrating a plasma processing apparatus according to another exemplary embodiment.

FIG. 2 is a diagram schematically illustrating the plasma processing apparatus according to the exemplary embodiment. The method MT may be applied to a plasma processing apparatus 1 illustrated in FIG. 2. The plasma processing apparatus 1 includes a chamber 10. The chamber 10 is a container providing an inner space 10s. The chamber 10 has an approximately cylindrical shape. A central axis AX illustrated in FIG. 2 is a central axis of the chamber 10 and the inner space 10s, and extends in a vertical direction.

The chamber 10 includes a chamber body 12. The chamber body 12 has an approximately cylindrical shape. The inner space 10s of the chamber 10 is provided inside the chamber body 12. The chamber body 12 includes a side wall 12a and a bottom part 12b. The side wall 12a forms a side wall of the chamber 10. The bottom part 12b forms a bottom part of the chamber 10. The chamber body 12 is formed of, for example, a metal such as aluminum. A plasma resistant film is formed on an inner wall surface of the chamber body 12. The film may be a ceramic film such as an alumite film or an yttrium oxide film. The chamber body 12 is grounded.

A passage 12p is formed in the side wall 12a. In a case where a substrate W is transferred between the inner space 10s and an outside of the chamber 10, the substrate W passes through the passage 12p. The passage 12p is openable and closable by a gate valve 12g. The gate valve 12g is provided along the side wall 12a.

A substrate support, that is, a support stage 14 is provided in the inner space 10s. The support stage 14 is supported by a support body 15. The support body 15 has a cylindrical shape. The support body 15 extends upward from the bottom part 12b of the chamber body 12. The support body 15 has an insulating property. The support body 15 is formed from, for example, a ceramic.

The support stage 14 is configured to support the substrate W. The support stage 14 shares the central axis AX with the chamber 10. The support stage 14 provides a mount area 14r. A center of the mount area 14r is located on the central axis AX. The substrate W is mounted on the mount area 14r such that a center of the substrate W is located on the central axis AX.

The support stage 14 includes an electrode plate 16, a lower electrode 18, and an electrostatic chuck 20. The electrode plate 16 has an approximately disc shape. The electrode plate 16 has conductivity. The electrode plate 16 is formed of a metal such as aluminum. The lower electrode 18 has a disc shape. The lower electrode 18 has the conductivity. The lower electrode 18 is formed of a metal such as aluminum. The lower electrode 18 is mounted on the electrode plate 16. The lower electrode 18 is electrically connected to the electrode plate 16.

A flow channel 18p is formed in the lower electrode 18. The flow channel 18p extends, for example, in a spiral shape in the lower electrode 18. A heat exchange medium (for example, a refrigerant) is supplied to the flow channel 18p from a circulation device 22 (for example, a chiller unit) of the heat exchange medium. The circulation device 22 is provided outside the chamber 10. The heat exchange medium supplied to the flow channel 18p returns to the circulation device 22. Due to heat exchange between the heat exchange medium and the lower electrode 18, a temperature of the substrate W mounted on the support stage 14 is controlled.

The electrostatic chuck 20 is provided on the lower electrode 18. The electrostatic chuck 20 has an approximately disc shape. The electrostatic chuck 20 includes a main body and an electrode. The main body of the electrostatic chuck 20 is made of a dielectric (for example, made of a ceramic). The electrode of the electrostatic chuck 20 is a conductive film, and is provided in the main body of the electrostatic chuck 20. A direct current power source 24 is connected to the electrode of the electrostatic chuck 20 through a switch. The electrostatic chuck 20 provides the above-described mount area 14r. In a case where a direct current voltage from the direct current power source 24 is applied to the electrode of the electrostatic chuck 20 in a state in which the substrate W is mounted on the electrostatic chuck 20 (on the mount area 14r), electrostatic attractive force is generated between the substrate W and the electrostatic chuck 20. Due to the generated electrostatic attractive force, the substrate W is attracted to the electrostatic chuck 20, and is held by the electrostatic chuck 20. The plasma processing apparatus 1 may be provided with a heat transfer gas supply line which provides a heat transfer gas (for example, a He gas) between the electrostatic chuck 20 and a lower surface of the substrate W.

One or more heaters (for example, one or more resistance heating elements) may be provided on an inside of the electrostatic chuck 20. In a case where electric power from a heater controller is provided to one or more heaters, the one or more heaters generate heat, and thus a temperature of the electrostatic chuck 20 and a temperature of the substrate W are adjusted.

A focus ring FR is installed on the support stage 14. The focus ring FR is an annular plate. The focus ring FR is mounted on the support stage 14 to extend in a circumferential direction around the central axis AX. The substrate W is disposed in an area surrounded by the focus ring FR on the support stage 14. The focus ring FR is formed of a silicon containing material such as silicon and quartz.

A cylindrical conductor 26 is provided around the support body 15. The conductor 26 is grounded. A cylindrical insulator 28 is provided above the conductor 26 to surround the support stage 14. The insulator 28 is formed of a ceramic such as quartz. An exhaust path is formed between the support stage 14 and the side wall 12a of the chamber body 12. A baffle plate 30 is provided in the exhaust path. The baffle plate 30 is an annular plate. A plurality of openings, which pass through the baffle plate 30, are formed in the baffle plate 30 in a plate thickness direction of the baffle plate 30. The baffle plate 30 is configured by forming a plasma resistant film, such as yttrium oxide, on a surface of a member formed of the metal such as aluminum.

An exhaust pipe 32 is connected to the bottom part 12b of the chamber body 12 below the baffle plate 30. The exhaust pipe 32 is capable of communicating with the exhaust path. An exhaust device 34 is connected to the exhaust pipe 32. The exhaust device 34 includes an automatic pressure control valve and a depressurizing pump such as a turbo-molecular pump. In a case where the exhaust device 34 is operated, a pressure in the inner space 10s is set to a designated pressure.

An upper electrode 36 is provided above the support stage 14. A portion of the inner space 10s is interposed between the upper electrode 36 and the support stage 14. The upper electrode 36 is provided to close an upper opening of the chamber body 12. A member 37 is interposed between the upper electrode 36 and an upper end of the chamber body 12. The member 37 is formed of an insulating material. The member 37 may be formed of a ceramic, for example, quartz. In one embodiment, the member 37 and a portion of a ground conductor, which will be described later, may be interposed between the upper electrode 36 and the upper end of the chamber body 12.

In one embodiment, the upper electrode 36 configures a shower head. In one embodiment, the upper electrode 36 includes a ceiling plate board 38 and a support body 40. The ceiling plate 38 is formed of, for example, silicon. Alternatively, the ceiling plate 38 is formed by providing a film formed of a ceramic, such as yttrium oxide, on a surface of a member formed of aluminum. In the ceiling plate 38, a plurality of gas discharge outlets 38h, which pass through the ceiling plate 38, are formed in a plate thickness direction of the ceiling plate 38.

The support body 40 is provided on the ceiling plate 38. The support body 40 is configured to detachably support the ceiling plate 38. The support body 40 is formed of a conductive material such as aluminum. A gas diffusion chamber 40d is formed inside the support body 40. A plurality of holes 40h are formed in the support body 40. The plurality of holes 40h extend downward from the gas diffusion chamber 40d. The plurality of holes 40h respectively communicate with the plurality of gas discharge outlets 38h.

A gas supply unit 41 is connected to the gas diffusion chamber 40d. The gas supply unit 41 is formed to supply a gas into the chamber 10, that is, the inner space 10s. The gas supply unit 41 is configured to be capable of outputting a plurality of gases. The plurality of gases include a process gas used for the plasma processing. In addition, the plurality of gases include a cleaning gas. The gas supply unit 41 includes a plurality of flow rate controllers and a plurality of valves. The gas supply unit 41 is configured to individually adjust flow rates of one or more gases to be output. The gases output from the gas supply unit 41 are discharged from the plurality of gas discharge outlets 38h to the inner space 10s through the gas diffusion chamber 40d and the plurality of openings 40h.

A flow channel 40p is formed in the support body 40. A chiller unit 42 is connected to the flow channel 40p. A refrigerant, such as coolant, is circulated between the flow channel 40p and the chiller unit 42. A temperature of the upper electrode 36 is adjusted through heat exchange between the refrigerant, which is supplied from the chiller unit 42 to the flow channel 40p, and the upper electrode 36.

The plasma processing apparatus 1 further includes a first radio frequency power source 43 and a second radio frequency power source 44. The first radio frequency power source 43 and the second radio frequency power source 44 are provided outside the chamber 10. The first radio frequency power source 43 is configured to generate a first radio frequency electric power mainly for generating the plasma. A frequency of the first radio frequency electric power is, for example, 100 MHz, but is not limited thereto. The first radio frequency power source 43 is electrically connected to the upper electrode 36 through a matching device 45 and a feeding conductor 48. The matching device 45 includes a matching circuit for matching an output impedance of the first radio frequency power source 43 and an impedance of a load side (a side of the upper electrode 36). The feeding conductor 48 is connected to the upper electrode 36 at a lower thereof. The feeding conductor 48 extends upward from the upper electrode 36. The feeding conductor 48 is a cylindrical or bar-shaped conductor, and a central axis thereof approximately coincides with the central axis AX. The first radio frequency power source 43 may be electrically connected to the lower electrode 18 through the matching device 45 instead of the upper electrode 36.

The second radio frequency power source 44 is configured to generate a second radio frequency electric power mainly for drawing ions to the substrate W, that is, a bias radio frequency electric power. A frequency of the second radio frequency electric power is lower than the frequency of the first radio frequency electric power. In one embodiment, the frequency of the second radio frequency electric power may be higher than 13.56 MHz. In one embodiment, the frequency of the second radio frequency electric power may be equal to or higher than 40 MHz. In one embodiment, the frequency of the second radio frequency electric power may be equal to or higher than 60 MHz. The second radio frequency power source 44 is electrically connected to the lower electrode 18 through the matching device 46. The matching device 46 includes a matching circuit for matching an output impedance of the second radio frequency power source 44 with the impedance of the load side (the side of the lower electrode 18).

In a case where the cleaning gas is supplied into the chamber 10 from the gas supply unit 41 and the first radio frequency electric power is supplied from the first radio frequency power source 43, a plasma is formed from the cleaning gas in the chamber 10. Cleaning is performed on the wall surface in the chamber 10 by the chemical species from the formed plasma. It is necessary to perform the cleaning on the wall surface in the chamber 10 on a side of the support stage 14, for example, a side wall surface. Therefore, the plasma processing apparatus 1 includes an electromagnet 60.

The electromagnet 60 is configured to form a magnetic field distribution in the chamber 10. The magnetic field distribution has a maximum horizontal component in a location on the focus ring FR or a location outside the focus ring FR in a radial direction with respect to the central axis AX. A location where the maximum horizontal component is acquired may be a location inside the chamber 10 in the radial direction, that is, a location in the inner space 10s. In one embodiment, the magnetic field distribution may have the maximum horizontal component in the location outside the focus ring FR in the radial direction. A residence time of electrons becomes long at a location where a large horizontal component magnetic field is formed. As a result, a density of the plasma rises at the location where the large horizontal component magnetic field is formed. Accordingly, in a case where the magnetic field distribution is formed by the electromagnet 60, the density of the plasma increases in a location which is close to the wall surface in the chamber 10 on the side of the support stage 14. As a result, the deposits are effectively removed from the wall surface in the chamber 10 on the side of the support stage 14.

In one embodiment, the electromagnet 60 includes a coil 64. The coil 64 is disposed above the upper electrode 36, that is, above the chamber 10. The coil 64 of the electromagnet 60 is connected to a drive power source 66 through a wiring 68. In a case where a current from the drive power source 66 is supplied to the coil 64, the magnetic field is formed by the electromagnet 60. The electromagnet 60 may further include a yoke 62. The yoke 62 is formed of a magnetic material. The yoke 62 includes a base portion 62a and a plurality of cylindrical portions 62b. The base portion 62a has an approximately annular and an approximately plate shape, and extends in a direction which is orthogonal to the central axis AX. Each of the plurality of cylindrical portions 62b has a cylindrical shape, and extends downward from the base portion 62a. The plurality of cylindrical portions 62b are coaxially provided with respect to the central axis AX. The coil 64 is wound around the central axis AX. The coil 64 is provided between two adjacent cylindrical portions 62b in the radial direction.

In one embodiment, a diameter $D_{CC}$ of a central line of the coil 64, which extends in a circumferential direction, is larger than an outer diameter $D_{FO}$ of the focus ring FR. That is, a value defined by ½ of a sum of an inner diameter $D_{CI}$ of the coil 64 and an outer diameter $D_{CO}$ of the coil 64 may be larger than the outer diameter $D_{FO}$ of the focus ring FR. According to the embodiment, the maximum horizontal component of the above-described magnetic field distribution is acquired in a location which has a distance defined by ¼ of the sum of the inner diameter $D_{CI}$ and the outer diameter $D_{CO}$ of the coil 64 from the central axis AX. This location is a location outside the focus ring FR in the radial direction. Accordingly, the density of the plasma increases in a location which is close to the wall surface in the chamber 10 on the side of the support stage 14. The value defined by ½ of the sum of the inner diameter $D_{CI}$ of the coil 64 and the outer diameter $D_{CO}$ of the coil 64 may be smaller than an inner diameter (diameter) of the chamber 10.

In one embodiment, the inner diameter $D_{CI}$ of the coil 64 may be larger than an inner diameter $D_{FI}$ of the focus ring FR, and may be smaller than the outer diameter $D_{FO}$ of the focus ring FR. According to the embodiment, the deposits formed on the focus ring FR may be also effectively removed.

In one embodiment, the plasma processing apparatus 1 further includes a ground conductor 50. The ground conductor 50 has conductivity. The ground conductor 50 is formed of a metal such as aluminum. The ground conductor 50 is grounded. The ground conductor 50 extends above the chamber body 12 to cover the upper electrode 36. The feeding conductor 48 extends upward while passing through a space surrounded by the ground conductor 50, and is connected to the first radio frequency power source 43 through the matching device 45 on an outside of the ground conductor 50.

The ground conductor 50 provides an external space ES in which the electromagnet 60 is disposed. The external space ES is closer to the inner space 10s than an upper end of the ground conductor 50, is separated upward from the upper electrode 36, and is shielded with respect to the upper electrode 36 by the ground conductor 50.

The ground conductor 50 may include a first portion 51, a second portion 52, and a third portion 53. The first portion 51 has a cylindrical shape. A central axis of the first portion 51 approximately coincides with the central axis AX. The first portion 51 extends upward from the chamber body 12. In the example illustrated in FIG. 2, the first portion 51 extends upward from an upper end of the side wall 12a of the chamber body 12. A lower end portion of the first portion 51 is interposed between the member 37 and the upper end of the side wall 12a.

The second portion 52 is separated upward from the upper electrode 36, and extends toward the central axis AX from the first portion 51. The second portion 52 has a plate shape extending in a direction which intersects with or is orthogonal to the central axis AX. The first portion 51 and the second portion 52 provide a first space IS1 on the upper electrode 36. The first space IS1 is a portion of a space on an inside (that is, the side of the upper electrode 36) of the ground conductor 50. A distance between the upper electrode 36 and the ground conductor 50 in the vertical direction is secured by the first space IS1. Accordingly, capacitive coupling between the ground conductor 50 and the upper electrode 36 is suppressed. A distance in the vertical direction between an upper surface of the upper electrode 36 and a lower surface of the second portion 52 of the ground conductor 50 is set to, for example, a distance which is equal to or larger than 60 mm.

The third portion 53 has a cylindrical shape. A central axis of the third portion 53 approximately coincides with the central axis AX. The third portion 53 extends to be closer to the central axis than the first portion 51. The third portion 53 extends upward from the second portion 52. The third portion 53 provides a second space IS2. The second space IS2 is a space on an inside of the second portion 52, and is a portion of a space on the inside (that is, the side of the upper electrode 36) of the ground conductor 50. The second space IS2 continues the first space IS1. The feeding conductor 48 extends upward through the first space IS1 and the second space IS2.

The external space ES is provided by the ground conductor 50 on an outside of the third portion 53, on the second portion 52, that is, above the inner space 10s. The external space ES extends in the circumferential direction around the central axis AX on the outside of the third portion 53 and on the second portion 52. The electromagnet 60 is disposed in the external space ES. A distance in the vertical direction between a lower end of the electromagnet 60 disposed in the external space ES and the upper surface of the upper electrode 36 is larger than 60 mm. In addition, a distance in the vertical direction between the lower end of the electromagnet 60 and the substrate W mounted on the support stage 14 may be equal to or smaller than 230 mm.

A distance between the electromagnet 60 disposed in the external space ES and the inner space 10s is relatively short. Accordingly, the magnetic field distribution may be effectively formed in the chamber 10 by the electromagnet 60 disposed on the outside of the ground conductor 50.

As described above, the drive power source 66 is connected to the coil 64 of the electromagnet 60. The electromagnet 60 and the drive power source 66 are disposed on the outside of the ground conductor 50. Accordingly, a filter for preventing inflow of a radio frequency wave into the drive power source 66 may not be provided between the coil 64 and the drive power source 66.

In one embodiment, the ground conductor 50 may further include a fourth portion 54, a fifth portion 55, and a sixth portion 56. The fourth portion 54 extends above the second portion 52 from the third portion 53 in the radial direction with respect to the central axis AX. The fourth portion 54 has a plate shape extending in a direction which intersects with or is orthogonal to the central axis AX. The fifth portion 55 has a cylindrical shape. A central axis of the fifth portion 55 approximately coincides with the central axis AX. The fifth portion 55 is separated further away from the central axis than the third portion 53, and extends upward from the fourth portion 54. The sixth portion 56 extends above the fourth portion 54 toward the central axis AX from the fifth portion 55. The sixth portion 56 has a plate shape extending in a direction which intersects with or is orthogonal to the central axis AX. In one embodiment, the ground conductor 50 includes a lid portion 57 which extends from the sixth portion to a vicinity of the feeding conductor 48.

The fourth portion 54, the fifth portion 55, and the sixth portion 56 provide a third space IS3. The third space IS3 is a space surrounded by the fourth portion 54, the fifth portion 55, and the sixth portion 56, and is a portion of the space on the inside of the ground conductor 50. The third space IS3 continues the second space IS2. The feeding conductor 48 further extends upward through the third space IS3. In the example illustrated in FIG. 2, the first to sixth portions are composed of three members. However, the number of members composing the ground conductor 50 may be an arbitrary number.

Figure 3:
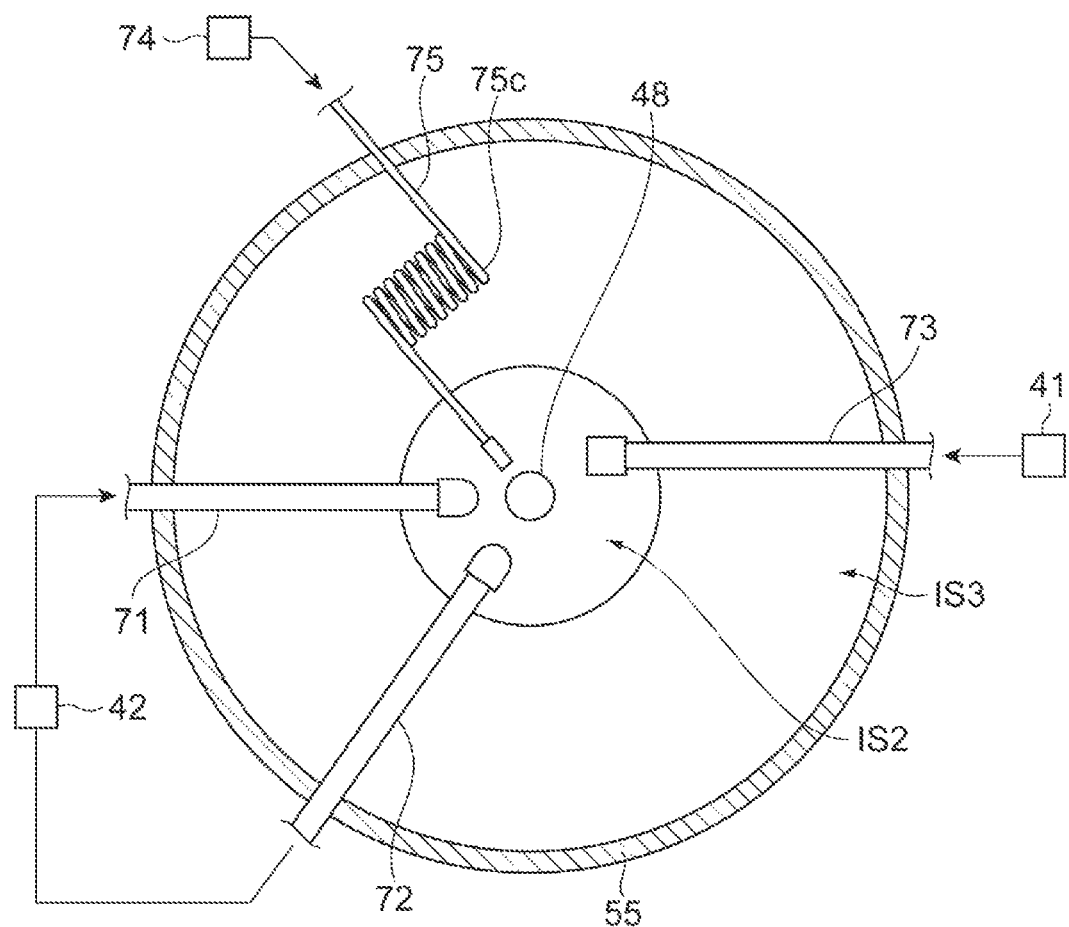
FIG. 3 is a plan view illustrating an example of a configuration of an inside of a ground conductor of the plasma processing apparatus illustrated in FIG. 2.

Hereinafter, FIG. 3 will be referred to, together with FIG. 2. FIG. 3 is a plan view illustrating an example of a configuration of an inside of a ground conductor of the plasma processing apparatus illustrated in FIG. 2. FIG. 3 illustrates a state in which the fifth portion 55 of the ground conductor 50 is cut by a horizontal surface. In one embodiment, the plasma processing apparatus 1 further includes a pipe 71 as illustrated in FIG. 2 and FIG. 3. The pipe 71 extends upward from the upper electrode 36 through the first space IS1 and the second space IS2, and extends through the third space IS3 to a side with respect to the ground conductor 50 and to an outside of the ground conductor 50. The pipe 71 is connected to the chiller unit 42 on the outside of the ground conductor 50. The refrigerant from the chiller unit 42 is supplied to the flow channel 40p through the pipe 71. In the third space IS3, the pipe 71 is substantially shielded from the upper electrode 36 by the fourth portion 54 of the ground conductor 50.

The plasma processing apparatus 1 further includes a pipe 72. The pipe 72 extends upward through the first space IS1 and the second space IS2, and extends through the third space IS3 to a side with respect to the ground conductor 50 and to an outside of the ground conductor 50. The pipe 72 is connected to the chiller unit 42 on the outside of the ground conductor 50. The refrigerant returns to the chiller unit 42 from the flow channel 40p through the pipe 72. In the third space IS3, the pipe 72 is substantially shielded from the upper electrode 36 by the fourth portion 54 of the ground conductor 50.

In one embodiment, the plasma processing apparatus 1 further includes a pipe 73. The pipe 73 extends upward from the upper electrode 36 through the first space IS1 and the second space IS2, and extends through the third space IS3 to a side with respect to the ground conductor 50 and to an outside of the ground conductor 50. The pipe 73 is connected to the gas supply unit 41 on the outside of the ground conductor 50. The gas, which is output from the gas supply unit 41, is supplied to the upper electrode 36, that is, the shower head through the pipe 73. In the third space IS3, the pipe 73 is substantially shielded from the upper electrode 36 by the fourth portion 54 of the ground conductor 50. The gas supply unit 41 and the upper electrode 36 (that is, the shower head) may be connected to each other through a plurality of pipes.

In one embodiment, the plasma processing apparatus 1 further includes a direct current power source 74 and a wiring 75. The direct current power source 74 is configured to generate a negative polarity direct current voltage to be applied to the upper electrode 36. The wiring 75 connects the direct current power source 74 and the upper electrode 36 to each other. The wiring 75 may include a coil 75c. The coil 75c is provided in the third space IS3. The wiring 75 extends upward from the upper electrode 36 through the first space IS1 and the second space IS2, and extends through the third space IS3 to a side with respect to the ground conductor 50 and to an outside of the ground conductor 50. The wiring 75 is electrically insulated from the fifth portion 55 and the ground conductor 50. The wiring 75 is connected to the direct current power source 74 on the outside of the ground conductor 50. In the third space IS3, the wiring 75 is substantially shielded from the upper electrode 36 by the fourth portion 54 of the ground conductor 50.

The plasma processing apparatus 1 further includes a controller 80. The controller 80 is configured to control the respective units of the plasma processing apparatus 1. The controller 80 may be a computer device. The controller 80 may include a processor, a storage device, such as a memory, an input device, such as a keyboard, a mouse, or a touch panel, a display device, an input/output interface of a control signal, and the like. In the storage device, a control program and recipe data are stored. The processor of the controller 80 executes a control program, and transmits the control signals for controlling the respective units of the plasma processing apparatus 1 according to the recipe data. The controller 80 is capable of controlling the respective units of the plasma processing apparatus 1 to perform the method MT.

The method MT will be described in detail with reference to FIG. 1 again. Hereinafter, the method MT will be described, using a case where the method MT is applied to the plasma processing apparatus 1 as an example. In addition, hereinafter, control of the respective units of the plasma processing apparatus 1, which is performed by the controller 80, will be described.

The method MT includes step ST1 and step ST2. While step ST1 and step ST2 are performed, the focus ring FR is mounted on the support stage 14 to extend around the central axis AX. Step ST1 and step ST2 may be performed in a state in which an object is not mounted on the support stage 14 in an area surrounded by the focus ring FR. Otherwise, step ST1 and step ST2 may be performed in a state in which a dummy substrate is mounted on the support stage 14 in the area surrounded by the focus ring FR.

In step ST1, the cleaning gas is supplied into the chamber 10. In order to perform step ST1, the controller 80 controls the gas supply unit 41 to supply the cleaning gas into the chamber 10. In addition, the controller 80 controls the exhaust device 34 to set a pressure in the chamber 10 to a designated pressure.

Subsequent step ST2 is performed while step ST1 is performed. In order to perform the cleaning on the wall surface in the chamber 10, the plasma is formed from the cleaning gas in the chamber 10. In step ST2, the magnetic field distribution is formed in the chamber by the electromagnet 60. As described above, the magnetic field distribution has the maximum horizontal component in the location on the focus ring FR or the location outside the focus ring FR in the radial direction with respect to the central axis AX.

In order to form the plasma from the cleaning gas in step ST2, the controller 80 controls the first radio frequency power source 43 to supply the first radio frequency electric power. In addition, in order to form the above-described magnetic field distribution in the chamber 10 by the electromagnet 60 in step ST2, the controller 80 controls the drive power source 66 to supply a current to the coil 64 of the electromagnet 60.

In step ST2, the magnetic field distribution which has the maximum horizontal component in the location on the focus ring FR or the location outside the focus ring FR is formed in the chamber 10. Accordingly, the density of the plasma increases in the location which is close to the wall surface in the chamber 10 on the side of the support stage 14. As a result, the deposits are effectively removed from the wall surface in the chamber 10 on the side of the support stage 14.

In one embodiment, the magnetic field distribution which is formed in step ST2 may have the maximum horizontal component in the location outside the focus ring in the radial direction.

In one embodiment, as described above, the value defined by ½ of the sum of the inner diameter $D_{CI}$ and the outer diameter $D_{CO}$ of the coil 64 may be larger than the outer diameter $D_{FO}$ of the focus ring FR. According to the embodiment, the maximum horizontal component of the above-described magnetic field distribution is acquired in the location which has the distance defined by ¼ of the sum of the inner diameter $D_{CI}$ and the outer diameter $D_{CO}$ of the coil 64 from the central axis AX. This location is a location outside the focus ring FR in the radial direction. Accordingly, the density of the plasma increases in the location which is close to the wall surface in the chamber 10 on the side of the support stage 14.

In one embodiment, as described above, the inner diameter $D_{CI}$ of the coil 64 may be larger than the inner diameter $D_{FI}$ of the focus ring FR and may be smaller than the outer diameter $D_{FO}$ of the focus ring FR. According to the embodiment, the deposits formed on the focus ring FR may be effectively removed.

While various exemplary embodiments have been described above, various omissions, substitutions and changes may be made without being limited to the exemplary embodiments described above. Elements of the different embodiments may be combined to form another embodiment.

For example, the electromagnet 60 may include a plurality of coils 64. The plurality of coils 64 are coaxially provided with respect to the central axis AX. A current supplied to each of the plurality of coils 64 is adjusted to form the above-described magnetic field distribution.

In addition, in another embodiment, the plasma processing apparatus may be another type plasma processing apparatus capable of forming the magnetic field by the electromagnet 60. As another type plasma processing apparatus, a capacitively-coupled plasma processing apparatus which is different from the plasma processing apparatus 1, an inductively-coupled plasma processing apparatus, or a plasma processing apparatus, which generates the plasma using a surface wave, such as a micro wave, may be exemplified.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A cleaning method comprising:
   (a) supplying a cleaning gas into a chamber of a plasma processing apparatus; and
   (b) forming a plasma from the cleaning gas in the chamber to perform cleaning on a wall surface in the chamber,
   wherein a focus ring is mounted on a substrate support in the chamber to extend around a central axis of the chamber, in (a) and (b),
   wherein a magnetic field distribution is formed in the chamber by an electromagnet in (b),
   wherein the magnetic field distribution has a maximum horizontal component in a location on the focus ring or a location outside the focus ring in a radial direction with respect to the central axis,
   wherein the magnetic field distribution has the maximum horizontal component in the location outside the focus ring in the radial direction,
   wherein the electromagnet has a coil provided above the chamber, and the coil extends in a circumferential direction around the central axis,
   wherein a value defined by ½ of a sum of an inner diameter and an outer diameter of the coil is larger than an outer diameter of the focus ring, and
   wherein the inner diameter of the coil is larger than an inner diameter of the focus ring and is smaller than the outer diameter of the focus ring.

2. The cleaning method according to claim 1, wherein (a) and (b) are performed in a state in which an object is not mounted on the substrate support in an area surrounded by the focus ring.

3. The cleaning method according to claim 1, wherein (a) and (b) are performed in a state in which a dummy substrate is mounted on the substrate support in an area surrounded by the focus ring.

4. The cleaning method according to claim 1, wherein the electromagnet has a coil extending in a circumferential direction around the central axis, and
   wherein the location in which the magnetic field distribution has the maximum horizontal component is a location having a distance which is defined by ¼ of a sum of an inner diameter and an outer diameter of the coil from the central axis.

5. A plasma processing apparatus comprising:
   a chamber;
   a substrate support provided in the chamber;
   a gas supply unit configured to supply a cleaning gas into the chamber;

a radio frequency power source configured to generate a radio frequency electric power to generate a plasma from a gas in the chamber;

an electromagnet configured to form a magnetic field distribution in the chamber;

a drive power source electrically connected to the electromagnet; and a controller configured to control the gas supply unit, the radio frequency power source, and the drive power source, wherein a focus ring is mounted on the substrate support to extend around a central axis of the chamber, wherein the controller is configured to
control the gas supply unit to supply the cleaning gas into the chamber,
control the radio frequency power source to supply the radio frequency electric power to perform cleaning on a wall surface in the chamber by forming a plasma from the cleaning gas in the chamber, and
control the drive power source to form a magnetic field distribution having a maximum horizontal component in a location on the focus ring or a location outside the focus ring in the chamber by the electromagnet in a radial direction with respect to the central axis, while the plasma is generated, wherein the magnetic field distribution has the maximum horizontal component in the location outside the focus ring in the radial direction, wherein the electromagnet has a coil provided above the chamber, and the coil extends in a circumferential direction around the central axis, wherein a value defined by ½ of a sum of an inner diameter and an outer diameter of the coil is larger than an outer diameter of the focus ring, and wherein the inner diameter of the coil is larger than an inner diameter of the focus ring and is smaller than the outer diameter of the focus ring.

6. The plasma processing apparatus according to claim 5, wherein the electromagnet has a yoke formed of a magnetic material.

7. The plasma processing apparatus according to claim 5, wherein the electromagnet has a coil extending in a circumferential direction around the central axis, and wherein the location in which the magnetic field distribution has the maximum horizontal component is a location having a distance which is defined by ¼ of a sum of an inner diameter and an outer diameter of the coil from the central axis.

8. The plasma processing apparatus according to claim 5, further comprising:
an upper electrode provided above the substrate support; and
a ground conductor extending above the chamber to cover the upper electrode and providing an external space in which the electromagnet is disposed.

9. The plasma processing apparatus according to claim 8, wherein the ground conductor includes:
a first portion having a cylindrical shape and extending upward with respect to the chamber;
a second portion having a plate shape and extending from the first portion in a direction which intersects with or is orthogonal to the central axis; and
a third portion having a cylindrical shape and extending upward from the second portion,
wherein a central axis of the first portion and a central axis of the second portion approximately coincide with the central axis of the chamber, and
wherein the third portion extends to be closer to the central axis than the first portion.

10. The plasma processing apparatus according to claim 9, wherein the external space is provided outside the third portion and on the second portion, and extends around the central axis of the chamber.

11. The plasma processing apparatus according to claim 9, wherein the ground conductor further includes:
a fourth portion having a plate shape and extending above the second portion in the direction which intersects with or is orthogonal to the central axis of the chamber;
a fifth portion having a cylindrical shape and extending upward from the fourth portion; and
a sixth portion having a plate shape and extending from the fifth portion in the direction which intersects with or is orthogonal to the central axis of the chamber, and
wherein an central axis of the fifth portion approximately coincides with the central axis of the chamber.

12. The plasma processing apparatus according to claim 5, wherein the electromagnet has a plurality of coils coaxially provided around the central axis.

13. The plasma processing apparatus according to claim 12, wherein currents respectively supplied to the plurality of coils are adjusted to form the magnetic field distribution.

14. The plasma processing apparatus according to claim 5, wherein the plasma processing apparatus is capacitively-coupled plasma processing apparatus, inductively-coupled plasma processing apparatus, or a plasma processing apparatus configured to generate a plasma using a surface wave.

* * * * *